(12) United States Patent
Partsch

(10) Patent No.: US 7,289,374 B2
(45) Date of Patent: Oct. 30, 2007

(54) CIRCUIT AND METHOD FOR ADJUSTING THRESHOLD DRIFT OVER TEMPERATURE IN A CMOS RECEIVER

(75) Inventor: Torsten Partsch, Raleigh, NC (US)

(73) Assignee: Infineon Technologies AG, Munich (DE)

( * ) Notice: Subject to any disclaimer, the term of this patent is extended or adjusted under 35 U.S.C. 154(b) by 432 days.

(21) Appl. No.: 10/882,592

(22) Filed: Jul. 1, 2004

(65) Prior Publication Data

US 2006/0003715 A1    Jan. 5, 2006

(51) Int. Cl.
*G11C 7/00* (2006.01)
(52) U.S. Cl. .................. 365/189.05; 365/211
(58) Field of Classification Search ........... 365/189.05, 365/211
See application file for complete search history.

(56) References Cited

U.S. PATENT DOCUMENTS

| | | | |
|---|---|---|---|
| 5,017,811 A | 5/1991 | Worley | |
| 5,111,081 A | 5/1992 | Atallah | |
| 5,329,184 A | 7/1994 | Redfern | |
| 5,384,736 A * | 1/1995 | Jung et al. ............. | 365/189.05 |
| 5,498,977 A | 3/1996 | Pickup | |
| 6,069,511 A | 5/2000 | Mohan | |
| 6,169,434 B1 | 1/2001 | Portmann | |
| 6,466,071 B2 | 10/2002 | Kim et al. | |
| 6,466,137 B1 * | 10/2002 | Lin et al. ............... | 340/825.69 |
| 6,489,821 B1 | 12/2002 | Kurd et al. | |
| 6,501,313 B2 | 12/2002 | Boerstler et al. | |
| 6,643,790 B1 | 11/2003 | Yu et al. | |
| 6,667,660 B2 | 12/2003 | Schrödinger et al. | |
| 6,690,202 B1 | 2/2004 | Groen et al. | |
| 6,826,390 B1 * | 11/2004 | Tamura ................... | 455/226.1 |
| 2003/0128061 A1 | 7/2003 | Heyne | |
| 2003/0210505 A1 | 11/2003 | Partsch et al. | |
| 2003/0210506 A1 | 11/2003 | Edmonds et al. | |
| 2004/0024561 A1 | 2/2004 | Huckaby et al. | |

* cited by examiner

*Primary Examiner*—Hoai V. Ho
(74) *Attorney, Agent, or Firm*—Slater & Matsil, L.L.P.

(57) ABSTRACT

A receiver for use in a device such as a memory device is provided. The receiver circuit is located on the same integrated circuit as a temperature sensor (or other sensor). A data receiver and strobe receiver are coupled to the temperature sensor. A flip-flop receives a data input from the data receiver and this data input is latched based upon the strobe receiver. In the preferred embodiment, the timing of these inputs is controlled, at least in part, by the temperature sensor output.

11 Claims, 3 Drawing Sheets

CIRCUIT AND METHOD FOR ADJUSTING THRESHOLD DRIFT OVER TEMPERATURE IN A CMOS RECEIVER

TECHNICAL FIELD

The present invention relates generally to circuits, and more particularly to a circuit and method for adjusting threshold drift over temperature in a CMOS receiver.

BACKGROUND

The preferred embodiment of the present invention is directed toward a data receiver in a device such as a double data rate (DDR) synchronous dynamic random access (SDRAM) memory. In a DDR SDRAM, data is sampled at both the rising edge and the falling edge of a clock signal. FIG. 1 shows a known DDR receiver 10.

Double data rate SDRAMs latch data VDQ with both edges of a data strobe $DQS_{in}$. To be able to do so, a data strobe signal VDQS is received on the SDRAM and then driven to the data receive and latch blocks. In these receive and latch blocks, the data and strobe signals are received in identical receiver elements. The core element of DDR SDRAM receiver elements is usually a differential amplifier 12 (14) or a derivative of a differential amplifier. In the illustrated circuit, the differential amplifier 12 receives the data signal VDQ and the differential amplifier 14 receives the strobe signal VDQS.

Each differential amplifier 12 (or 14) compares the input voltage on the DQ (or DQS) node to a reference voltage VREF to detect the value (HIGH or LOW) of the received signal. At the output of the data receiver 12, the signal DQin is then delayed by delay element 16 to match the delay that is needed for the internal DQS signal to be driven to the data latches 18 and 20 individual receive and latch blocks. Thus the data DQ and the data strobe DQS are realigned at the latches 18 and 20. The delay on the DQS signal results from both the RC delay of the wires and the transition delay of the driver block 22.

After the delay block 16, the data line is split to two latch blocks 18 and 20. In this case, a master-slave flip-flop (MS-FF) 18 retains the data sent with the falling edge of DQS and a master-slave-slave flip-flop (MSS-FF) 20 retains the data sent with the rising edge of DQS. The input stages of both latches 18 and 20 need a sufficient setup and hold time to operate correctly.

FIG. 2 shows a typical differential amplifier 12. (Only amplifier 12 is shown since amplifier 14 includes the same elements.) Differential amplifier 12 includes transistors 26-32 arranged as a current mirror. The differential amplifier 12 typically features some sort of current source 24 as a bias to operate the amplifier. A typical DDR SDRAM includes a number of differential amplifiers and the bias current of all of these devices can add up to several milliamps. This relatively large current consumes a significant portion of the power budget of a DDR SDRAM, especially during standby modes. For specialty DDR SDRAMS, such as a Mobile DDR SDRAM where power consumption is one of the most important features of the device, a more power efficient receiver implementation is desirable.

Other devices use CMOS receivers instead of differential amplifiers. A CMOS receiver is basically an inverter, including an n-channel transistor coupled in series with a p-channel transistor. CMOS inverters, however, have a major drawback as compared to differential amplifiers. The threshold voltage of a CMOS inverter changes greatly over process temperature and voltage (PVT) variations. A changing threshold of a receiver influences the switching point of that receiver. If the threshold of a receiver is "off center," the duty cycle of the received signal is distorted.

FIG. 3 shows the effects of such a duty cycle distortion through a CMOS receiver. The upper pair of signals (INnomTH, OUTnomTH) display the ideal receiver input to output behavior. The threshold of the receiver (dashed line) is in the middle of the input signal INnomTH. That is, the threshold voltage is substantially equal to the reference voltage. Thus the output signal OUTnomTH has the same duty cycle (i.e., PWin=PWout).

The second pair of signals (INhighTH, OUThighTH) shows the situation where the threshold is higher than the reference voltage. Referring to the figure, the signal INhighTH shows that the receiver has a threshold that is located above the middle of the signal INhighTH. As a result, the signal OUThighTH has a duty cycle that favors the low phase of the pulse (i.e., PWin>PWout).

Finally, the third (lowest on the page) pair of signals (INlowTH, OUTlowTH) shows the situation where the threshold is lower than the reference voltage. When the threshold of the receiver is lower than the middle of the input signal InlowTH, the resulting duty cycle of the output signal OUTlowTH favors the high phase of the pulse (i.e., PWin>PWout).

Those duty cycle distortions severely impact the setup and hold margin of the input stages. Since a DDR SDRAM needs to latch data to both edges of the VDQS, any deviation of the pulse width affects the setup and hold system budget with a factor of two. Large duty cycle distortions are therefore not acceptable, especially at higher speeds where the system budget for setup and hold time gets smaller.

SUMMARY OF THE INVENTION

These and other problems are generally solved or circumvented, and technical advantages are generally achieved, by preferred embodiments of the present invention, which provide a circuit and method for adjusting threshold drift over temperature in a CMOS receiver.

In one aspect, the present invention provides for the use of an on-chip temperature sensor to change the p-channel to n-channel size ratio of a CMOS receiver to adjust the threshold of that receiver over temperature variations. By adjusting the threshold and the resulting output duty cycle of the CMOS receiver, this receiver is especially useful in lower power applications such as specialty DDR SDRAM devices that feature a temperature sensor.

In the preferred embodiment, a receiver for use in a device such as a memory device is provided. The receiver circuit includes a temperature sensor (or other sensor) with an output for carrying a signal with a value related to a temperature (or other parameter) of the receiver circuit. A data receiver and strobe receiver are coupled to the temperature sensor. A flip-flop receives data input from the data receiver and this data input is latched based upon the strobe receiver. In the preferred embodiment, the timing of these inputs is controlled, at least in part, by the temperature sensor output.

In accordance with a preferred embodiment of the present invention, the receiver circuits each include a first transistor (e.g., NMOS) with a current path coupled between a first voltage node (e.g., VSS) and the receiver output. A second transistor (e.g., PMOS) has a current path coupled between a second voltage node (e.g., VDD) and the output and a third transistor has a current path coupled between the second voltage node (e.g., VDD) and the output. Each of these transistors has a gate coupled to the input node of the receiver. A switch is coupled between the third transistor and the output node. This switch can be turned on or off in response to an indication to adjust the threshold voltage of the receiver circuit. For example, this indication can be related to temperature or other threshold varying parameters.

The use of CMOS receivers results in a lower power consumption, which benefits low power applications for DDR SDRAMs. The power reduction compared to a circuit with differential amplifier receivers results from the elimination of the bias currents and the elimination of the current used for the VREF signal generation either "on chip" or in the system.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a DDR SDRAM. The invention may also be applied, however, to other semiconductor devices where it is useful to have the low power advantages of a CMOS receiver circuit but also useful to maintain the duty cycle of the received data. Examples of such devices include high-speed communications devices, logic devices such as microprocessors and other types of memory devices.

Some specialty DDR SDRAM devices (e.g., a mobile DDR SDRAM) feature a temperature sensor. This component is typically fabricated on the semiconductor chip and outputs a signal that varies based upon the temperature of the integrated circuit. In the preferred embodiment, the information from the temperature sensor can be used to adjust the threshold of the CMOS resistor over temperature. In other embodiments, other sensors, such as those that measure process variations, voltage variations or other variations, can be used instead of, or in addition to, the temperature sensor.

Figure 1:
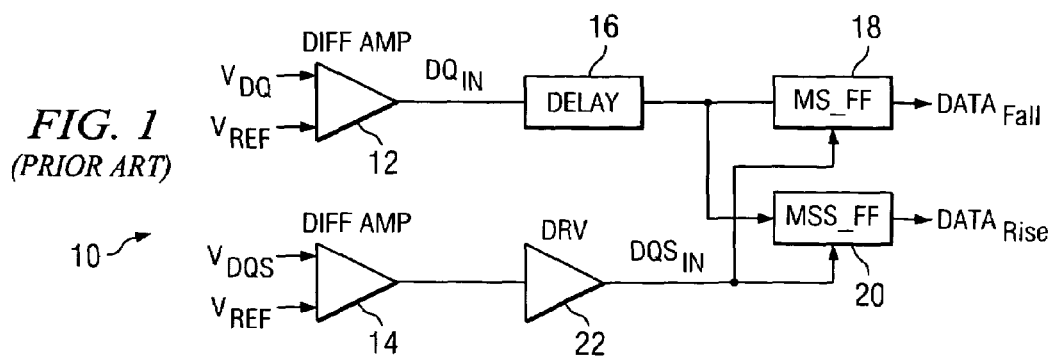
FIG. 1 is a block diagram of a prior art receiver.
Figure 2:
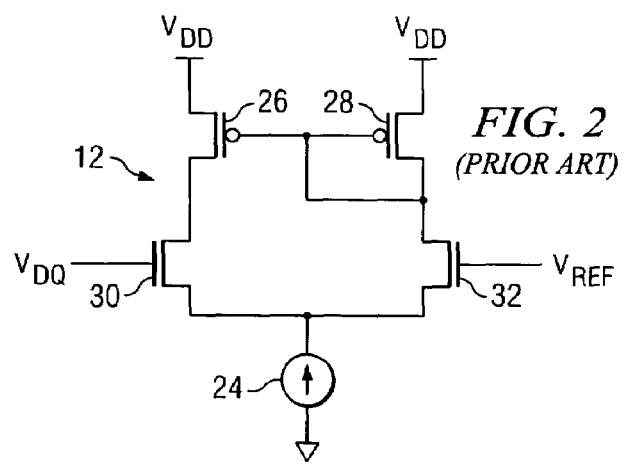
FIG. 2 is a diagram of a prior art differential amplifier.
Figure 3:
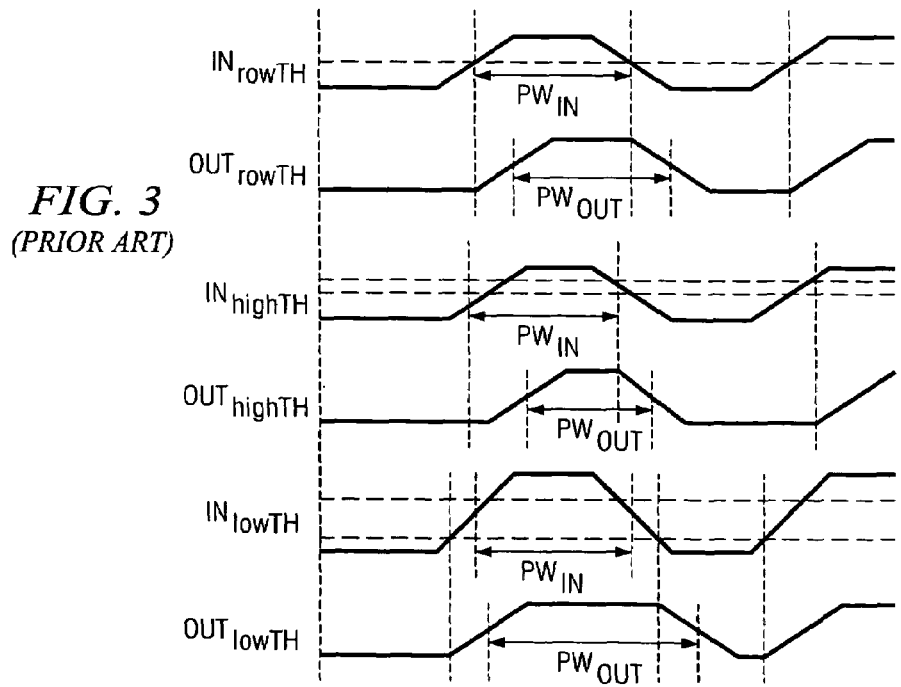
FIG. 3 is a timing diagram of a receiver that distorts the duty cycle of a signal.
Figure 4:
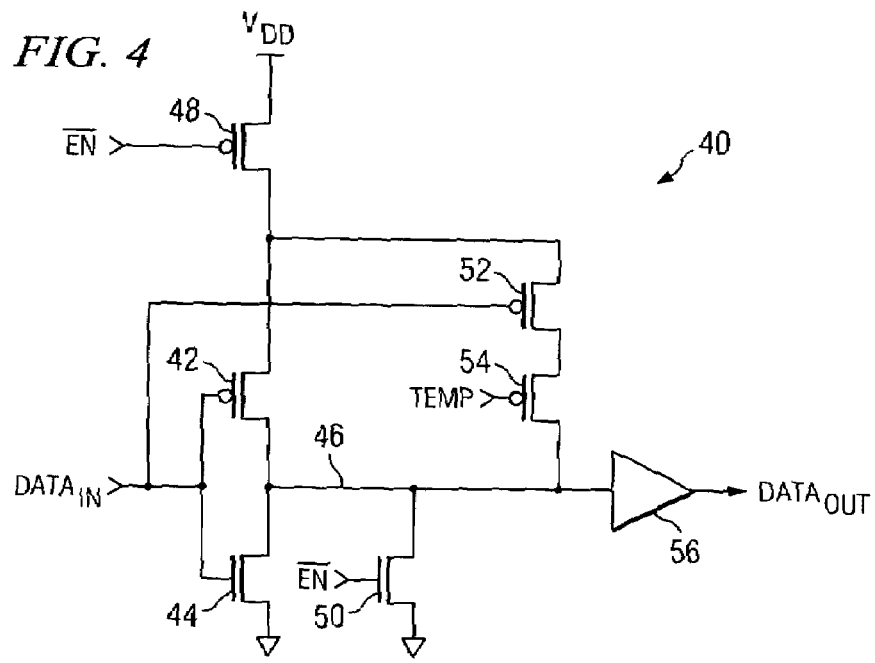
FIG. 4 shows a receiver of a preferred embodiment of the invention.

FIG. 4 shows a CMOS receiver with a two-segment temperature controlled duty cycle adjustment. The receiver includes a p-channel field effect transistor 42 coupled in series with an n-channel field effect transistor 44. These transistors 42 and 44 form the basic CMOS receiver (e.g., coupled as an inverter). As such, the transistor 42 includes a current path coupled between the supply node VDD (e.g., 3.3V or 2.5V or 1.8V) and the inverter output node 46. Similarly, transistor 44 has a current path coupled between the ground node and the output node 46. Both transistors 42 and 44 include a gate coupled to the data input node DATAin. The inverter output node 46 is coupled to an optional driver 56.

The CMOS receiver 40 can be disabled by the transistors 48 and 50 using the enable signal/EN. In this embodiment, the transistor 48 is a p-channel transistor with a current path coupled between the pull-up transistor 42 and the supply node VDD. When the enable signal/EN is active (i.e., LOW in this case) the transistor 48 electrically couples pull-up transistor 42 to the power supply VDD to allow proper operation of the inverter. When the enable signal/EN is inactive (i.e., HIGH), the transistor 48 turns off and prevents the inverter from receiving power.

The transistor 50 is, in this embodiment, an n-channel transistor with a current path coupled between the inverter output node 46 and ground. When the enable signal/EN is active (i.e., LOW), the transistor 50 is turned off and does not affect operation. When the enable signal/EN is inactive (i.e., HIGH), however, the transistor 50 is rendered conductive and holds the output node 46 in a low voltage state.

The embodiment CMOS receiver 40 features at least one additional transistor 52 coupled in parallel to either p-channel transistor 42 or n-channel transistor 44. In the example of FIG. 4, a p-channel transistor 52 is coupled in parallel to the input p-channel transistor 42. In other embodiments, an n-channel transistor (not shown) can be coupled in parallel to pull-down transistor 44. In some embodiment, multiple ones of these transistors can be included.

The transistor 52 can be switched on or off with the control signal TEMP, which is used to turn on or turn off switch 54. In this case, the switch 54 is an n-channel transistor with a current path coupled between the current path of the additional transistor 42 and the output node 46. The control signal TEMP is derived from the temperature sensor 58 (shown in FIG. 5). Adding or subtracting this p-channel transistor 52 to the circuit can change the PFET to NFET size ratio of the inverter 42/44 according to the value of the TEMP signal. Switching the TEMP signal according to a temperature threshold measured by the temperature sensor divides the CMOS receiver operation mode into two temperature segments (e.g., warmer or colder than the temperature threshold). By changing the PFET to NFET ratio, the switching threshold of the receiver can be changed. To refine the threshold adjustment, more "temperature segments" can be added by adding more p-channel and/or n-channel transistors in parallel. Each of these transistors would be controlled by different TEMP signal versions.

In the preferred embodiment, the control signal TEMP is a digital signal that is in first binary state (e.g., high) when the device temperature exceeds a temperature threshold and is in a second binary state (e.g., low) when the device temperature is below the temperature threshold. In an alternate embodiment, the transistor 52 can be operated in its linear range by an analog control signal TEMP. In this example, the resistance, and therefore the amount of current flow, will be varied as the value of the signal TEMP varies through the operating range of the transistor 52.

Figure 5:
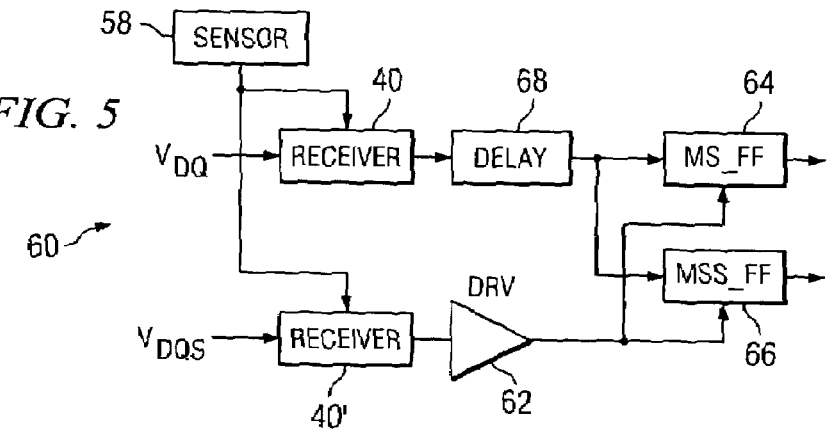
FIG. 5 shows the receiver of FIG. 4 in a data receiver circuit.

FIG. 5 shows a new receiver 60 concept with a temperature sensor 58. The data receivers 40 and 40' contain the CMOS receiver illustrated in FIG. 4, the described variations thereof. The receiver circuit 60 includes a temperature sensor 58 with an output for carrying a signal TEMP. As discussed above, the value of the signal TEMP is related to a temperature of the receiver circuit 60. An on-chip temperature sensor is described in U.S. patent application Ser. No. 10/144,572, filed May 13, 2002, which is published as 2003/0210505 and Ser. No. 10/144,579, filed May 13, 2002, which published as 2003/0210506. Both of these applications are incorporated herein by reference.

A data receiver 40 has an input coupled to a data input node to receive data signal VDQ. The data receiver 40 also including a control input coupled to the output of the temperature sensor 58, as discussed above. Similarly, a strobe receiver 40' includes an input coupled to the strobe input VDQS. The strobe receiver 40' is also controlled by the output of the temperature sensor 58.

The output of the strobe receiver 40' is provided to a driver 62, which drives the latch control inputs of flip-flop 64 and also flip-flop 66. These flip-flops 64 and 66 can be implemented with any appropriate latch circuit. For timing purposes, a delay element 68 is coupled between the output of data receiver 40 and the inputs of the latches 64 and 66. After the delay element 68, the data line is applied to both flip-flops 64 and 66. The master-slave flip-flop 64 retains the data sent with the falling edge of DQS and the master-slave-slave flip-flop 66 retains the data sent with to the rising edge of DQS.

Figure 6:
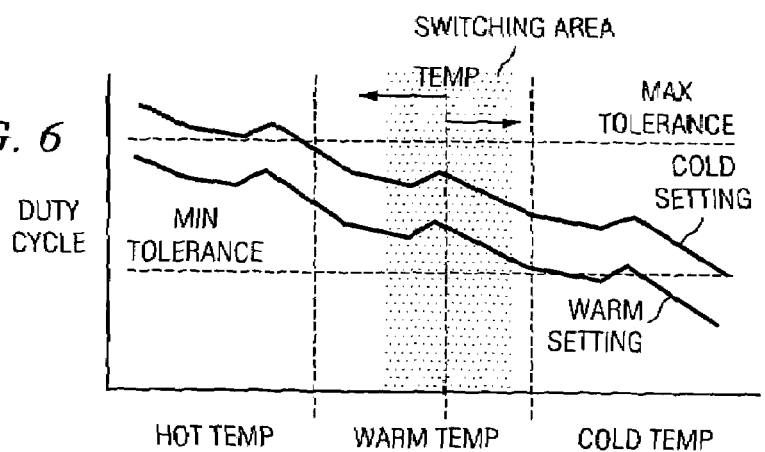
FIG. 6 is a graph showing the duty cycle of the receiver output over temperature.

FIG. 6 provides a graph showing the duty cycle of the receiver output over temperatures for both receiver settings of the control signal TEMP. For example, a TEMP signal with a HIGH value indicates the "warm setting" and a TEMP signal with a low value indicates a "cold setting." The graphs are generated by changing voltage and process conditions over each temperature. (The black vertical lines indicate each set of changes.) Both graphs have a decreasing duty cycle towards the colder temperatures. The variations of the slope are caused by other influences to the duty cycle that are not compensated with this solution (mostly caused by process and voltage variations). The vertical dashed line in the middle of the "Warm" area indicates the temperature that changes the level of the TEMP signal from FIG. 4. (In the example of FIG. 4: TEMP=high=>Hot temperature segment; TEMP=low=>Cold segment). The shaded area over the dashed line indicates the error tolerance of the TEMP signal, which is based on the accuracy of the temperature sensor and other factors.

The dashed horizontal lines, labeled "Max Tolerance" and "Min Tolerance," indicate the tolerance limits of the signal duty cycle with which the DDR SDRAM can guarantee the DQ setup and hold times. Neither the warm nor the cold setting itself can guarantee these tolerance limits of the device. Switching between the warm and the cold setting within the temperature range, indicated by the shaded rectangle, results in a duty cycle over the whole temperature range that fulfills the DQ setup and hold requirements of the device.

Figure 7:
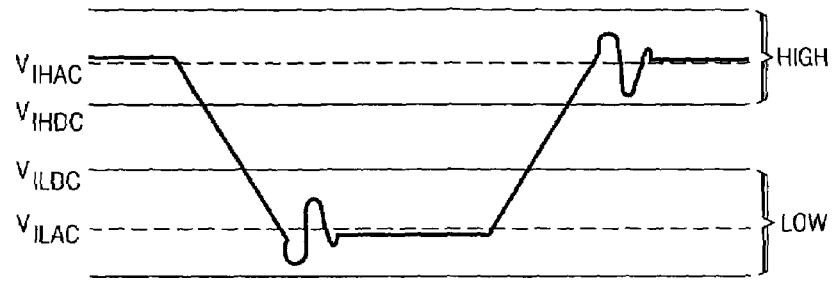
FIG. 7 illustrates an example of an input level specification for DQ and DQS signals.

FIG. 7 illustrates an example of an input level specification for DQ and DQS signals. The upper shaded area of the picture indicates the area where a DQ or DQS signal is interpreted as HIGH while the lower shaded area indicates the LOW signal area. The white area indicates the signal noise margin between the two shaded areas. To ensure that the receiver operates correctly, the threshold of the receiver should be within the white area at all times over all PVT variations. Adjusting the input threshold of the DQ and DQS receiver over temperature also helps to guarantee that the threshold of the receivers stays within the white area of the diagram.

Figure 8:
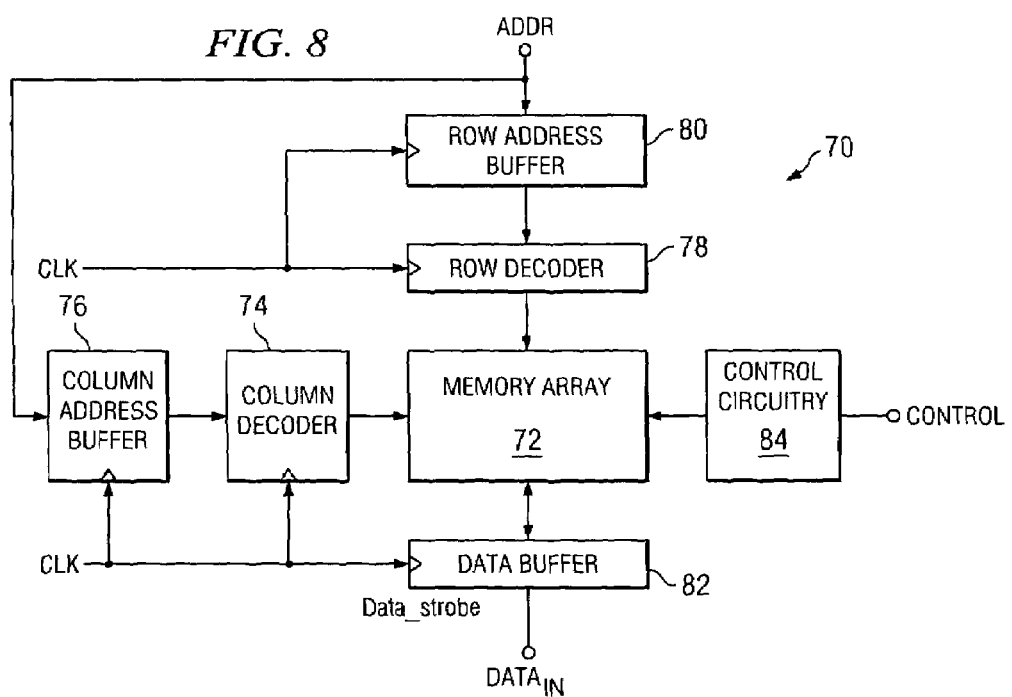
FIG. 8 is a simplified block diagram of a memory device that can utilize aspects of the present invention.

In the preferred embodiment, the data receiver is used in a double data rate SDRAM device. FIG. 8 illustrates a functional block diagram of a DRAM device 70. Preferably, all of the elements shown in FIG. 8, including the temperature sensor, are formed on a single semiconductor substrate. An array 72 includes a number of memory cells arranged in rows and columns. For a DRAM, each memory cell including a pass transistor is coupled in series with a storage capacitor. The memory cells are coupled to a number of wordlines along each row and to a number of bitlines along each column. As is known in the art, the bitlines are arranged in complementary pairs.

To access a particular cell in the array 72, an address signal ADDR is transmitted to a column address buffer 76 and row address buffer 80. In a typical DRAM chip, the column address and row address share external pins so that the row address is received at a first time and the column address is received at a second time. The ADDR signals may be transmitted by an external device, such as a memory controller (not shown), for example.

The column address buffer 76 and row address buffer 80 are adapted to buffer the address signal. The outputs of the column address buffer 76 and row address buffer 80 are coupled to a column decoder 74 and row decoder 78, respectively. The column and row decoders 74 and 78 are adapted to decode the signals received from the column address buffer 76 and row address buffer 80, respectively, to provide the signal input to the array 72 such that the selected row and column can be selected.

In FIG. 8, the decoders 74 and 78 are shown as single blocks. It should be understood, however, that the decoders might carry out several levels of predecoding and decoding. Some, all, or none of these levels may be clocked.

Data that is addressed in memory 70 will be written into memory 72 or read from memory 72 via data buffer (DB) 82. The data receiver 60 discussed above is included within the data buffer 82. Once again, this portion of FIG. 8 is simplified. The data buffer and the associated line are provided to represent the read and write path, which may include a large number of lines and other components (e.g., secondary sense amplifiers). In the preferred embodiment, multiple bits (e.g., 4, 8 or 16) are input and output simultaneously. As a result, multiple data receivers 40 will be included along with a data strobe receiver 40'.

Also shown in FIG. 8 is control circuitry 84, which is a simplified illustration of control signals. A number of control signals, referred to generically as CONTROL, are received from a source external to the memory device 70 (e.g., from a memory controller, not shown). The control circuitry block 84 is shown as being coupled to the array, where it will provide various control signals to control operation of the device. A clock signal CLK is also shown in order to illustrate that the various components may be clocked, either by an external clock or clocks derived from the external clock or other signals. The output of the control circuitry 84 will typically control the row and the column path and also the data path. The data path can also be clocked in addition to the data strobe.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description.

It is therefore intended that the appended claims encompass any such modifications or embodiments.

What is claimed is:

1. A receiver circuit comprising:
   a first transistor with a current path coupled between a first voltage node and an output node, the first transistor including a gate coupled to an input node;
   a second transistor with a current path coupled between a second voltage node and the output node, the second transistor including a gate coupled to the input node;
   a third transistor with a current path coupled between the second voltage node and the output node, the third transistor including a gate coupled to the input node; and
   a switch with a current path coupled between the current path of the third transistor and the output node, the switch being turned on or off in response to an indication to adjust a threshold voltage of the receiver circuit.

2. The circuit of claim 1 wherein the first transistor comprises an n-channel transistor and the first voltage node is coupled to a ground potential and wherein the second and third transistors comprise p-channel transistors and the second voltage node is coupled to a VDD potential.

3. The circuit of claim 1 wherein the first transistor comprises a p-channel transistor and the first voltage node is coupled to a VDD potential and wherein the second and third transistors comprise n-channel transistors and the second voltage node is coupled to a ground potential.

4. The circuit of claim 1 and further comprising a temperature sensor, the temperature sensor coupled to a control input of the switch.

5. The circuit of claim 1 and further comprising:
   a fourth transistor with a current path coupled between the second voltage node and the output node, the fourth transistor including a gate coupled to the input node; and
   a second switch with a current path coupled between the current path of the fourth transistor and the output node, the second switch being turned on or off in response to a second indication to adjust a threshold voltage of the receiver circuit.

6. The circuit of claim 1 and further comprising:
   a fourth transistor with a current path coupled between the first voltage node and the output node, the fourth transistor including a gate coupled to the input node; and
   a second switch with a current path coupled between the current path of the fourth transistor and the output node, the second switch being turned on or off in response to a second indication to adjust a threshold voltage of the receiver circuit.

7. A method of receiving a signal, the method comprising:
   receiving an input signal at an input node of a receiver, the receiver having a nominal switching threshold;
   measuring a temperature of the receiver;
   adjusting the switching threshold of the receiver based on the measured characteristic; and
   driving the input signal from the receiver.

8. A method of receiving a signal, the method comprising:
   receiving an input signal at an input node of a CMOS receiver, the receiver having a nominal switching threshold;
   measuring characteristic of the receiver;
   adjusting the switching threshold of the receiver based on the measured characteristic,
   wherein adjusting the switching threshold comprises varying a PFET to NFET size ratio of an inverter within the receiver; and
   driving the input signal from the receiver.

9. A method of receiving a signal, the method comprising:
   receiving an input signal at an input node of a receiver, the receiver having a nominal switching threshold;
   measuring a characteristic of the receiver;
   adjusting the switching threshold of the receiver based on the measured characteristic;
   driving the input signal from the receiver;
   latching the input signal; and
   receiving a strobe signal, wherein latching the input signal comprises latching the input signal in response to a transition of the strobe signal.

10. The method of claim 9 wherein latching the input signal comprises retaining a value of the input signal when the strobe signal transitions from a low level to a high level and also retaining a value of the input signal when the strobe signal transitions from the high level to the low level.

11. The method of claim 10 and further comprising storing a value based on the input signal in a memory cell, the memory cell being located on the same semiconductor substrate as the receiver, the memory cell including a storage capacitor.

* * * * *